(12) United States Patent
Hsieh et al.

(10) Patent No.: US 9,977,474 B2
(45) Date of Patent: May 22, 2018

(54) HEAT DISSIPATING ASSEMBLY AND ELECTRONIC DEVICE USING THE SAME

(71) Applicant: Acer Incorporated, New Taipei (TW)

(72) Inventors: Cheng-Wen Hsieh, New Taipei (TW); Wen-Neng Liao, New Taipei (TW)

(73) Assignee: Acer Incorporated, New Taipei (TW)

( * ) Notice: Subject to any disclaimer, the term of this patent is extended or adjusted under 35 U.S.C. 154(b) by 96 days.

(21) Appl. No.: 15/081,786

(22) Filed: Mar. 25, 2016

(65) Prior Publication Data

US 2016/0209894 A1 Jul. 21, 2016

Related U.S. Application Data

(63) Continuation of application No. 14/190,102, filed on Feb. 26, 2014, now Pat. No. 9,332,675.

(51) Int. Cl.
| | |
|---|---|
| *G06F 1/20* | (2006.01) |
| *F28D 15/02* | (2006.01) |
| *F28D 15/04* | (2006.01) |
| *H05K 7/20* | (2006.01) |
| *F28F 13/08* | (2006.01) |
| *F28F 7/00* | (2006.01) |
| *F28D 15/00* | (2006.01) |

(52) U.S. Cl.
CPC ......... *G06F 1/203* (2013.01); *F28D 15/0233* (2013.01); *F28D 15/0266* (2013.01); *F28D 15/0275* (2013.01); *F28D 15/043* (2013.01); *F28F 13/08* (2013.01); *G06F 1/20* (2013.01); *H05K 7/20* (2013.01); *H05K 7/20336* (2013.01); *F28D 15/00* (2013.01); *F28D 15/02* (2013.01); *F28D 15/04* (2013.01); *F28F 7/00* (2013.01)

(58) Field of Classification Search
None
See application file for complete search history.

(56) References Cited

U.S. PATENT DOCUMENTS

| | | | | |
|---|---|---|---|---|
| 2004/0008489 | A1* | 1/2004 | Minamitani | G06F 1/203 361/699 |
| 2008/0106865 | A1 | 5/2008 | Luo | |
| 2013/0135822 | A1* | 5/2013 | Chen | F28D 15/0275 361/679.52 |

FOREIGN PATENT DOCUMENTS

| | | |
|---|---|---|
| CN | 2569345 | 8/2003 |
| CN | 1490695 | 4/2004 |
| CN | 101389200 | 3/2009 |
| CN | 201594216 | 9/2010 |

* cited by examiner

*Primary Examiner* — Dimary Lopez Cruz
*Assistant Examiner* — Zhengfu Feng
(74) *Attorney, Agent, or Firm* — J.C. PATENTS

(57) ABSTRACT

A heat dissipating assembly suited for an electronic device is provided. The electronic device has at least one heat source. The heat dissipating assembly includes a first tube, a second tube, and a fluid. The first tube has an inlet and an outlet, wherein a bore size of the inlet is smaller than a bore size of the outlet. Heat generated from the heat source is transferred to the first tube. Two opposite ends of the second tube are connected to the inlet and the outlet such that the first and the second tubes are formed into a closed loop. The fluid is filled in the closed loop. The fluid in the first tube transferred from the inlet toward the outlet absorbs the heat and is transferred to the second tube for heat dissipating. An electronic device is also provided.

18 Claims, 8 Drawing Sheets

HEAT DISSIPATING ASSEMBLY AND ELECTRONIC DEVICE USING THE SAME

CROSS-REFERENCE TO RELATED APPLICATION

This application is a continuation application of and claims the priority benefit of a prior application Ser. No. 14/190,102, filed on Feb. 26, 2014, now allowed. The prior application Ser. No. 14/190,102 claims the priority benefit of Taiwan application serial no. 102140464, filed on Nov. 7, 2013. The entirety of each of the above-mentioned patent applications is hereby incorporated by reference herein and made a part of this specification.

BACKGROUND OF THE INVENTION

Field of Invention

The invention relates to a heat dissipating assembly, and particularly relates to a heat dissipating assembly of an electronic device.

Description of Related Art

With the advances in modern technology, since the function of notebooks have become increasingly robust, and the sizes thereof are smaller and smaller which makes them easy to be carried on, the notebooks have gradually become the mainstream market of consumer electronics. In order to reduce the thickness of the notebooks, some notebooks are arranged with central processing units (CPUs) of low wattage and adopt a design without fans, wherein heat generated by the CPU located at a host is usually transferred to the screen by a cooling fluid to increase a heat dissipating area.

However, a transmission efficiency of the cooling liquid still may be affected by opening and closing angles between the host and the screen in the above method. Once after the cooling liquid absorbs the heat, bubbles produced therefrom may also easily affect movement of the fluid. Therefore, the cooling fluid still has to be driven by a pump to maintain the overall circulation of the cooling fluid. Thus, an energy consumption of the host may not be reduced then, and the device may not be further thinned and miniaturized due to the presence of the pump in the space. In addition, the heat dissipating assembly need to be configured with the host and the screen in structure, and thus it is difficult to maintain integrity of the device in mechanical design and appearance.

According to the above, how to provide the electronic device with the heat dissipating assembly of better thermal performances and simultaneously having integrity with the electronic device in the appearance has then become problems need to be overcome for person skilled in the related art.

SUMMARY OF THE INVENTION

The invention is to provide a heat dissipating assembly and an electronic device using the same, wherein by absorbing heat through internal structure of the heat dissipating assembly, a two-phase and unidirectional circulated flow is produced so as to enhance thermal performance of a body of the electronic device at different states.

The heat dissipating assembly of the invention is suitable for an electronic device. The electronic device has at least one heat source. The heat dissipating assembly includes a first tube, a second tube, and a fluid. The first tube has an inlet and an outlet. A bore size of the inlet is less than a bore size of the outlet. Heat generated by the heat source is transferred to the first tube. Two opposite ends of the second tube are connected respectively to the inlet and the outlet of the first tube such that the first tube and the second tube are formed into a closed loop. The fluid is filled in the closed loop, wherein the fluid in the first tube is transferred from the inlet to the outlet. The fluid absorbs the heat which is transferred to the first tube and the heat is transferred to the second tube with the fluid for heat dissipating.

The electronic device of the invention includes a body, a heat source and a heat dissipating assembly. The body has two parts which can open and close relatively to each other. The heat source is provided in the body in one or both of the two parts. The heat dissipating assembly is assembled in the body. The heat dissipating assembly includes a first tube, a second tube, and a fluid. The first tube is located in one of the two parts. The first tube has an inlet and an outlet, a bore size of the inlet is less than a bore size of the outlet. Heat generated by the heat source is transferred to the first tube. The second tube is located in another one of the two parts. Two opposite ends of the second tube are connected respectively to the inlet and the outlet of the first tube such that the first tube and the second tube are formed into a closed loop.

According to the above, the first tube and the second tube respectively configured in different parts of the body of the electronic device are connected to each other and formed into a closed loop. After the heat generated by the heat source is transferred to the first tube, a two-phase flow is generated therein, and an autologous flow from the inlet to the outlet is produced due to a pressure difference with the bore sizes between the outlet and the inlet of the first tube, so that the heat with the fluid is transferred to the second tube in another part for heat dissipating.

In order to make the aforementioned and other features and advantages of the invention comprehensible, embodiments accompanied with figures are described in detail below.

DESCRIPTION OF EMBODIMENTS

Figure 1:
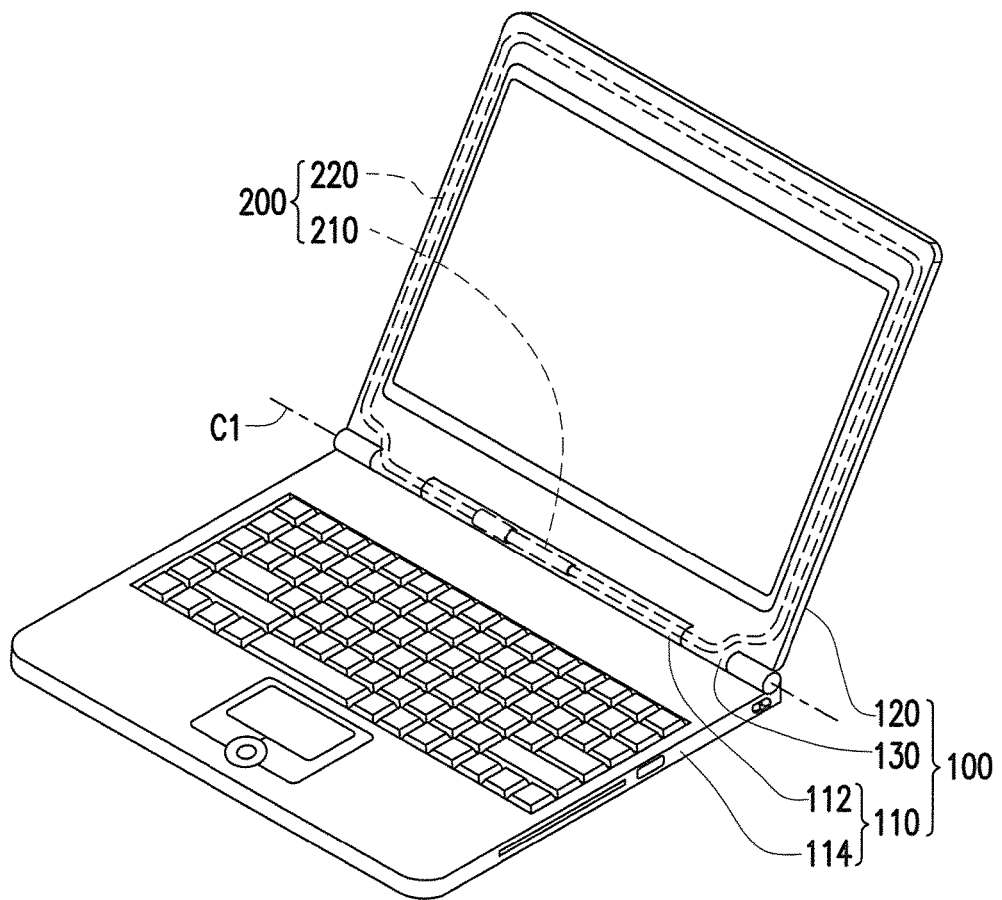
FIG. 1 is a schematic diagram of an electronic device according to an embodiment of the invention.
Figure 2:
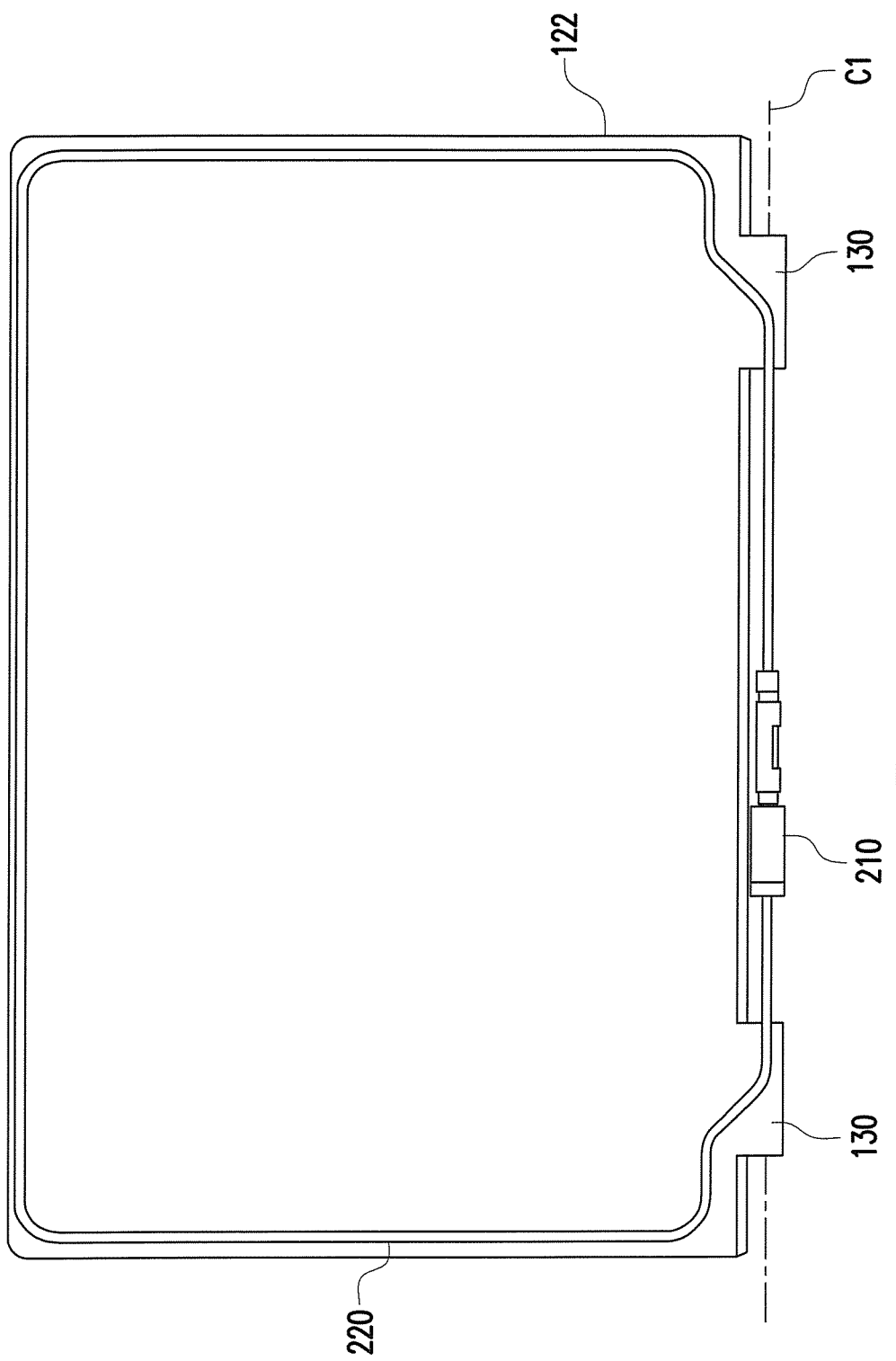
FIG. 2 to FIG. 4 respectively illustrates partial enlarged views of the electronic device in FIG. 1.
Figure 3:
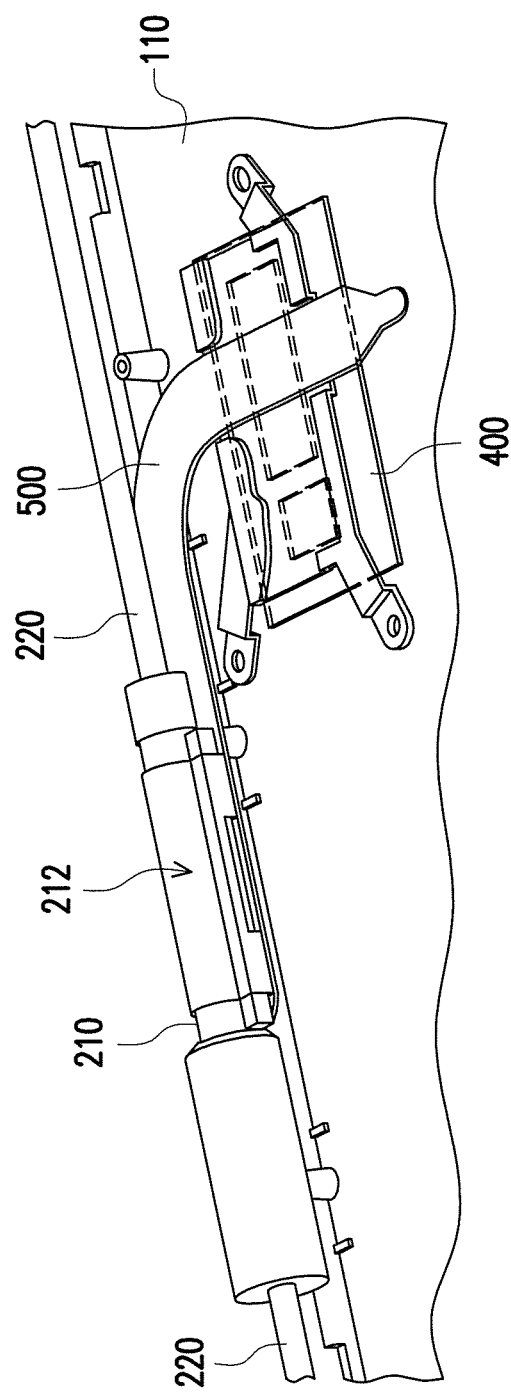
Figure 4:
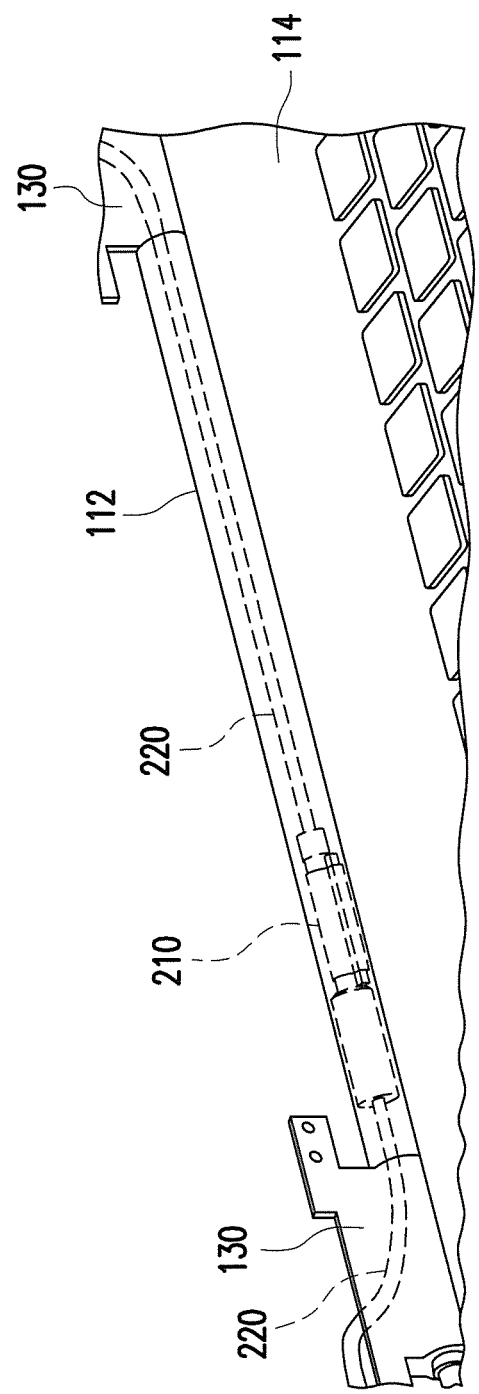

FIG. 1 is a schematic diagram of an electronic device according to an embodiment of the invention. FIG. 2 to FIG. 4 respectively illustrates partial enlarged views of the electronic device in FIG. 1. Meanwhile, in FIG. 2 to FIG. 4, some elements of the electronic device are omitted so that characteristics of elements relevant to the invention can be clearly described. Please refer to FIG. 1 to FIG. 4 simultaneously. In the embodiment, an electronic device 10 includes a body 100 and a heat dissipating assembly 200. The body 100 includes the first part 110 and the second part 120 which are pivotally connected to each other, wherein the first part 110 is a host of a notebook and the second part 120 is a display thereof, but the embodiment is not limited thereto.

Herein, the first part 110 and the second part 120 are able to be opened and closed relatively by a rotating shaft 130. Furthermore, at least a portion of the rotating shaft 130 and the second part 120 are formed as an integral structure. As shown in FIG. 2 and FIG. 4, the rotating shaft 130 and a frame 122 of the second part 120 are formed as an integral structure that a shaft portion 112 of the first part 110 is connected thereto, so that the shaft portion 112 which is protruded from a main body 114 is pivotally connected to a pair of the rotating shafts 130, and a central axis of the rotating shaft 130 is consistent with a central axis of the shaft portion 112, such that the second part 120 rotates relatively to the first part 110 and makes the electronic device 10 achieves the effect of opening and closing.

In the embodiment, the heat dissipating assembly 200 includes a first tube 210 and a second tube 220 connected to each other. The first tube 210 is disposed in the shaft portion 112 of the first part 110. The second tube 220 is connected to the first tube 210 and extended to the second part 120 from the first part 110 through the rotating shaft 130. According to the configuration above, a central axis of the first tube 210, a central axis of the shaft portion 112, and the central axis of the rotating shaft 130 are consistent with each other (that is, the central axes described above are located on a same central axis C1). Meanwhile, the rotating shaft 130 and the second part 120 are configured as an integral structure, the first tube 210 and the second tube 220 are rotated with the shaft 130 relatively to the first part 110 in the central axis C1. Accordingly, it is not necessary for the heat dissipating assembly 200 to be exposed from the first part 110 or from the second part 120, and the body 100 of the electronic device 10 is integral in appearance.

In addition, please refer to FIG. 3 again. The electronic device 10 of the embodiment further includes a heat source 400 and a heat pipe 500 disposed in the first part 110, wherein the heat source 400 is a mainly relating heat-generating source in the notebook or the electronic device, for example, a central processing unit (CPU) or a graphic processing unit (GPU). The heat pipe 500 is connected between the heat source 400 and a heating end 212 of the first tube 210 such that the heat generated by the heat source 400 is transferred to heating end 212 by the heat pipe 500.

Combining modes between the heat pipe 500 and the first tube 210 are not limited herein. For example, there could be an enclosed space or an open space existed between the heat pipe 500 and the heating end 212 of the first tube 210. In addition, there could be filled with heat-conductive materials such as thermal greases or oils between the heat pipe 500 and the first tube 210 for thermal conduction and lubrication.

Figure 5:
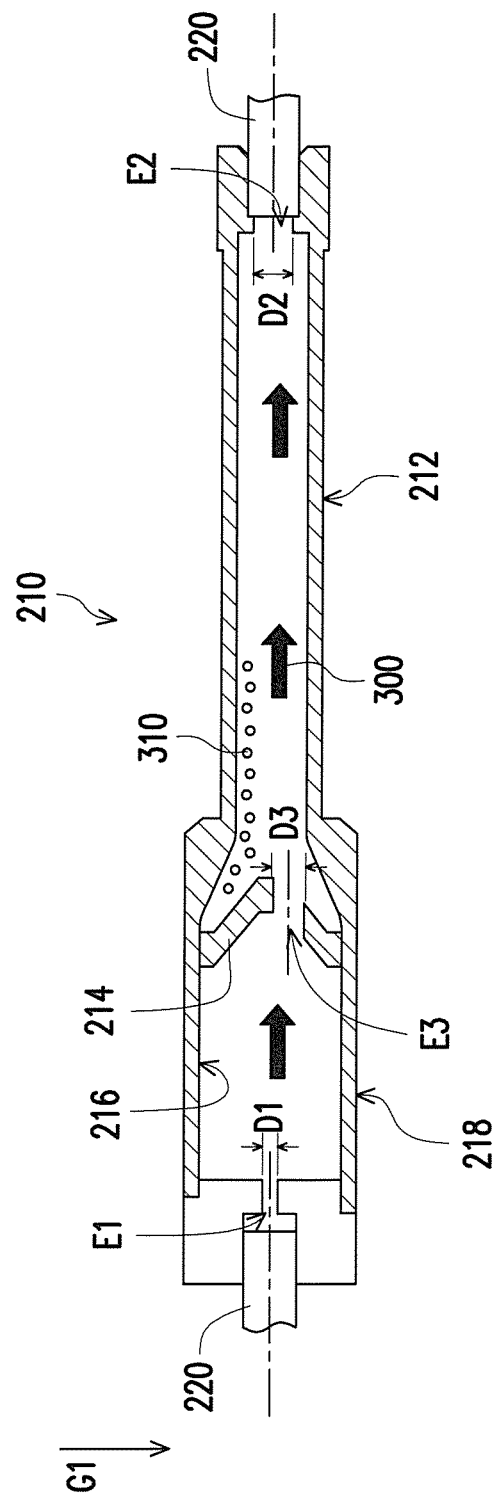
FIG. 5 is a sectional view of the first tube in the heat dissipating assembly of FIG. 1 to FIG. 4.

In addition, FIG. 5 is a sectional view of the first tube in the heat dissipating assembly of FIG. 1 to FIG. 4. Please refer to FIG. 5. In the embodiment, the first tube 210 has an inlet E1 and an outlet E2 which is opposite thereto, and two opposite ends of the second tube 220 are connected respectively to the inlet E1 and the outlet E2, such that the first tube 210 and the second tube 220 are formed into a closed loop as shown in FIG. 1 and FIG. 2. A fluid 300 (arrows in FIG. 5 are illustrated herein to indicate a flow direction of the fluid 300) is filled in the closed loop.

Since a tube diameter of the first tube 210 is various, and according to Bernoulli's Principle, the larger tube diameter poses a higher pressure to the fluid 300 such that the fluid 300 flows in a direction from a higher pressure (with larger tube diameter) toward a lower pressure (smaller tube diameter). Accordingly, the fluid 300 in the first tube 210 can move from the inlet E1 to the outlet E2 and further forms a circulation automatically in the closed loop without a use of pump additionally.

Accordingly, the fluid 300 located at the heating end 212 can therefore absorb heat and vaporize so as to produce bubbles 310. These bubbles 310 are mixed with other fluid 300 which is not vaporized and form into a two-phase fluid including a liquid phase and a gas phase. Moreover, based on the above structural characteristics, the bubbles 310 and the fluid 300 are moved from the inlet E1 to the outlet E2, and to the second tube 220, such that the heat can be transferred from the first part 110 to the second part 120 for heat dissipating. As shown in FIG. 1 and FIG. 2, the second tube 220 is configured along a periphery of the second part 120, and a path length of the second tube 220 is greater than a path length of the first tube 210. In other words, the heat brought by the two-phase fluid which is transferred to the second tube 220 can be dissipated out from the body 10 by a sufficient area and the path length provided by the second part 220. After that, the cooled fluid 300 is transferred into the first tube 210 through the inlet E1 for heat exchanging again.

Furthermore, as mentioned above, the second part 120 is the display of the notebook. A LCD screen with a high resolution has become a mainstream currently. However, the LCD screen with a high resolution is generally with high power consumption, and so a temperature of the LCD screen itself is bound to be increased, and a life of the LCD screen is decreased as the temperature is increased. Generally, a chipset or at a light source of the LCD screen may have a higher temperature; therefore, a heterochromatic phenomenon is prone to be happened at theses two locations. In another embodiment not illustrated of the invention, the path length of the second tube may also be passed through a heat source site of the above LCD screen so as to decrease the temperature of the screen itself, further to increase the life thereof, and to reduce the occurrence of bright spots simultaneously.

However, relatively speaking, the second tube 220 is configured in the second part 120; therefore, the driving force of the two-phase fluid in the closed loop is affected by an angle between the second part 120 and the first part 110. Moreover, the bubbles 310 generated by the fluid 300 after absorbing heat at the heating end 212 are increased correspondingly to the heat absorption. However, a space in the first tube 210 is limited, and the increased bubbles 310 do not move in a fixed moving direction, so a flow of the liquid phased fluid is prone to be blocked in the closed loop by the bubbles 310, or even the bubbles 310 are reversely moved relative to the fluid 300.

According to the above, please refer again to FIG. 5. In the first tube 210 of the embodiment, a bore size D1 of the inlet E1 is less than a bore size D2 of the outlet E2, which causes a pressure difference (namely, a velocity difference is caused) of the fluid 300 and enhances the driving force which of the fluid 300 moving from the inlet E1 to the outlet E2. On the other hand, the first tube 210 further has at least one barrier 214, which is located between the inlet E1 and the heating end 212. The barrier 214 is a protruding structure extending from an inner wall 216 of the first tube 210, and an extending direction thereof is forward to the flowing direction of the fluid 300 in the first tube 210. One side of the barrier 214 is on the inner wall 216 and another side of the barrier 214 extends away from the inner wall 216 and forms an opening E3 to facilitate the fluid 300 to pass through. Additionally, in the embodiment, a bore size D3 of the opening E3 is between the bore size D1 of the inlet E1 and the bore size D2 of the outlet E2. In other words, by the variety of the bore sizes of the inlet E1, the opening E2, and the outlet E3 (D1<D3<D2) in the first tube 210, the pressure difference of the fluid 300 in the first tube 210 is enhanced, so as to increase the driving force needed for the flow of the fluid 300.

It should be noted that, the tubes described in the embodiment are all described as cylindrical tubes, so when the bore sizes are described, the diameters thereof are described as the subject, but the invention is not limited thereto. In another embodiment not illustrated, the internal chambers of the tubes may also be square columns or polygonal prisms, etc., and the bore sizes now are described as cross-sectional areas of the internal chambers of the tubes.

Figure 6:
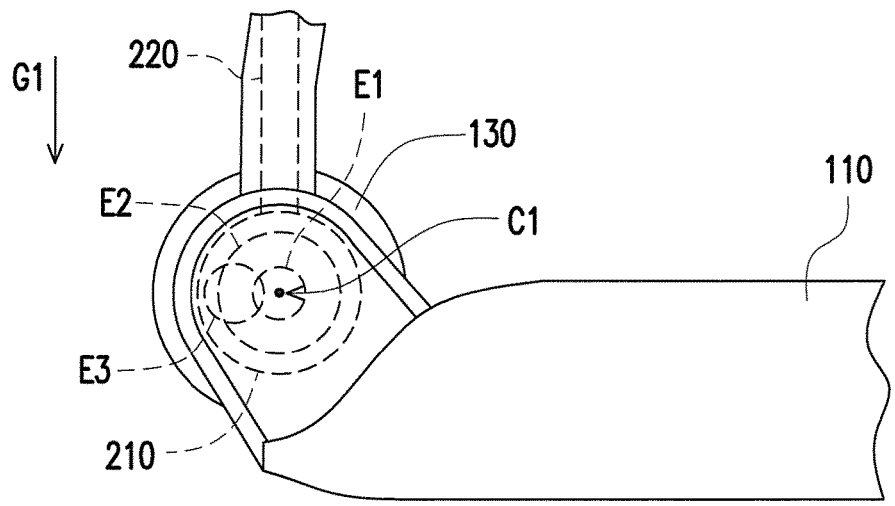
FIG. 6 and FIG. 7 are schematic diagrams of electronic device in FIG. 1 at different states, respectively.
Figure 7:
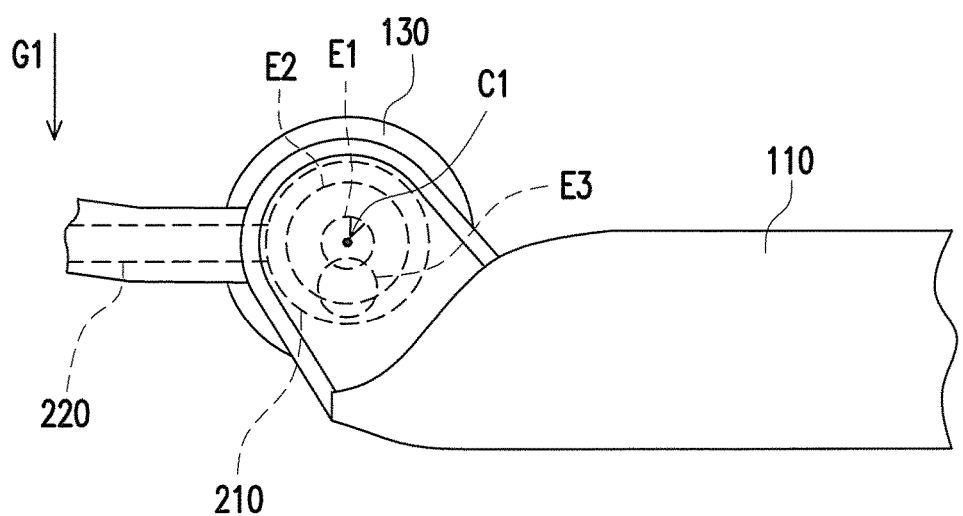

FIG. 6 and FIG. 7 are schematic diagrams of electronic device in FIG. 1 at different states, respectively. Please refer to FIG. 5 to FIG. 7 simultaneously. It should be noted that, in a gravity direction G1, the barrier 214 and the opening E3 thereof are configured in an up and down manner. In other words, a height difference (in the gravity direction G1) between the barrier 214 and the opening E3 are presented no matter the electronic device 10 is at the state shown in FIG. 6 or the state shown in FIG. 7. In other words, in the gravity direction G1, the outlet E2 and the opening E3 of the first tube 210 are also configured as up and down, that is, the opening E3 of the barriers 214 is configured as downwardly decentred relatively to the central axis C1 of the first tube 210 (that is, the height difference is presented between the opening E3 and the outlet E2 in the gravity direction G1).

Accordingly, if the bubbles 310 generated by the fluid 300 when absorbing heat at the heating end 212 are so much that their movement which is reversely relative to the flow direction of the fluid 300 is produced, those bubbles 310 can be intercepted by the barrier 214 in a non-heating end 218 of the first tube 210 so as to prevent the bubbles from reversely moving to the inlet E1 and blocking the liquid phased fluid 300.

Figure 8:
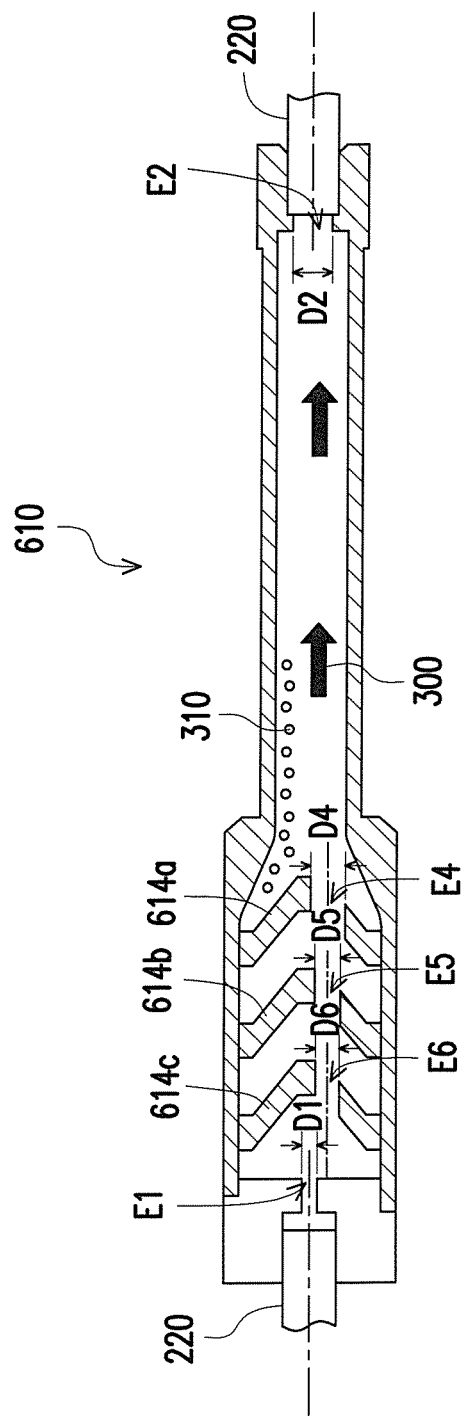
FIG. 8 is a partial sectional view of a heat dissipating assembly according to another embodiment of the invention.

FIG. 8 is a partial sectional view of a heat dissipating assembly according to another embodiment of the invention. Please refer to FIG. 8. A difference between this embodiment and the embodiment above is that the first tube 610 of the heat dissipating assembly has a plurality of barriers 614a, 614b, and 614c. Three barriers are taken as an example herein but not limited thereto. It should be noted that, bore sizes D4 to D6 of openings E4 to E6 formed by barriers 614a, 614b, and 614c are gradually decreased, the bore size D4 of the opening E4 is less than the bore size D2 of the outlet E2, and the bore size D6 of the opening E6 is greater than the bore size D1 of the inlet E1. That is, in the first tube 610, along a path from the inlet E1 to the opening E2, the bore sizes are gradually increasing. Accordingly, the heat dissipating assembly of the embodiment can effectively intercept the bubbles 310 generated by the fluid 300 by using the plurality of barriers 614a, 614b, and 614c. Additionally, the driving force for the fluid 300 to flow in the first tube 610 is enhanced due to the variety of the bore sizes (D1<D6<D5<D4<D2) of the heat dissipating assembly of the embodiment.

Figure 9:
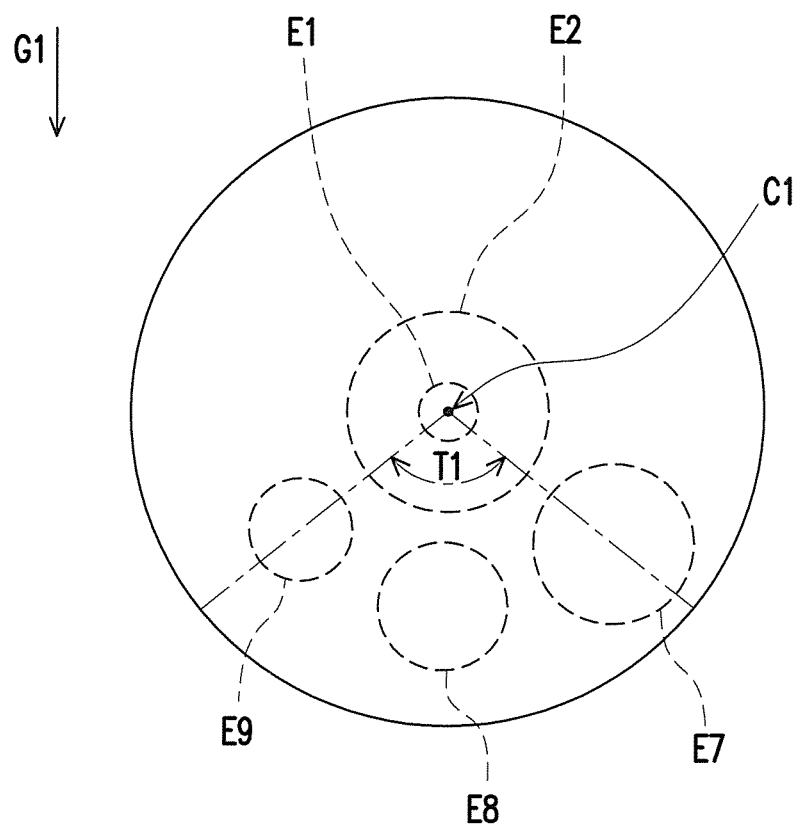
FIG. 9 is a schematic diagram of a heat dissipating assembly according to still another embodiment of the invention.

FIG. 9 is a schematic diagram of a heat dissipating assembly according to still another embodiment of the invention. Please refer to FIG. 9 and also compare it with FIG. 6 and FIG. 7. In the embodiment, the heat dissipating assembly includes a plurality of barriers and openings E7 to E9 formed thereby. The openings E7 to E9 are arranged as surrounding the central axis C1, that is, the openings E7 to E9 are distributed in a range of a sector angle T1 relatively to the central axis C1, and the sector angle T1 can correspond to the relative opening and closing angle of the second part 120 to the first part 110. Accordingly, the certain height difference are maintained between the openings E7 to E9 and the outlet E2 in the gravity direction G1 whatever the relative opening and closing angle of the second part 120 to the first part 110 is (as shown in FIG. 6 and FIG. 7), which means that the bubbles may be effectively blocked by the barriers. In other words, the corresponded barriers and openings may be disposed in the first tube by designers according to the opening and closing angles of the part so as to reduce the effect to the thermal performance of the heat dissipating assembly due to the opening and closing of the part.

According to the above, the first tube and the second tube of the heat dissipating assembly are connected to each other and formed into the closed loop, wherein the first tube and the second tube are respectively configured in different parts of the body. After the heat of the heat source is transferred to the first tube, a two-phase flow is generated therein, and an autologous flow from the inlet to the outlet is produced due to a pressure difference with the bore sizes between the outlet and the inlet of the first tube, so that the heat with the fluid is transferred to the second tube in another part for heat dissipating.

Furthermore, at least one barrier is extended out from the inner wall of the first tube, wherein the extending direction thereof is forward to the flowing direction of the fluid and the opening which allows the liquid phased fluid to pass through is formed from one side of the barrier. Accordingly, when the bubbles are produced by the fluid at the heating end due to absorbing heat and increased as the heat increasing, the barrier intercepts the bubbles moving reversely to the fluid such that retardation of the fluid is prevented. In addition, the bore size of the opening is between the bore size of the inlet and the bore size of the outlet, so as to create the trend in structure that the opening increases gradually along the flow direction of the fluid. Accordingly, the driving force for the fluid may be further enhanced, so that as the part of the body opens and closes relatively to each other, the heat dissipating assembly still keeps a normal operation.

The invention has been disclosed above in the preferred embodiments, but is not limited to those. It is known to persons skilled in the art that some modifications and innovations may be made without departing from the spirit and scope of the invention. Therefore, the scope of the invention should be defined by the following claims.

What is claimed is:

1. A heat dissipating assembly, suitable for an electronic device, the electronic device having a heat source, the heat dissipating assembly comprising:
   a closed loop tube disposed in the electronic device and filled with a fluid, a heat generated by the heat source being transferred to a portion of the closed loop tube, the fluid absorbing the heat while flowing through the portion of the closed loop tube and dissipating the heat from the closed loop tube to the electronic device while flowing through another portion of the closed loop tube; and
   at least one barrier located in the portion of the closed loop tube, wherein the barrier is higher than a passage of the fluid in the portion of the closed loop tube in a gravity direction,
   wherein the fluid producing bubbles due to absorbing the heat in the portion of the closed loop tube, and parts of the bubbles moving in a direction opposite to a flowing direction of the fluid are intercepted by the barrier.

2. The heat dissipating assembly as claimed in claim 1, wherein in the gravity direction, the closed loop tube is located on a plane orthogonal to the gravity direction.

3. The heat dissipating assembly as claimed in claim 1, wherein the electronic device has a main plane larger than other planes, and the closed loop tube is located on a plane parallel to the main plane.

4. The heat dissipating assembly as claimed in claim 3, wherein the electronic device has a display on the main plane.

5. The heat dissipating assembly as claimed in claim 1, wherein one side of the barrier is on an inner wall of the portion of the closed loop tube, another side of the barrier extends away from the inner wall and forms an opening, and the fluid passes through the opening of the barrier.

6. The heat dissipating assembly as claimed in claim 1, wherein an extending direction of the barrier is forward to the flowing direction of the fluid in the portion of the closed loop tube.

7. The heat dissipating assembly as claimed in claim 1, wherein the portion of the closed loop tube is divided into a first section and a second section, the fluid flows from the first section toward the second section, the heat is transferred to the first section, a diameter of the first section is greater than a diameter of the second section, and the barrier is disposed in the first section with an extending direction forward to the flowing direction of the fluid.

8. The heat dissipating assembly as claimed in claim 7, wherein the barrier is disposed at a convergent portion of the first section connecting to the second section.

9. The heat dissipating assembly as claimed in claim 7, wherein one side of the barrier is on an inner wall of the first section, and another side of the barrier extends away from the inner wall.

10. An electronic device, comprising:
a body;
a heat source, disposed in the body;
a heat dissipating assembly, disposed in the body, comprising:
a closed loop tube, disposed in the body and filled with a fluid, a heat generated from the heat source being transferred to a portion of the closed loop tube, the fluid absorbing the heat while flowing through the portion of the closed loop tube and dissipating the heat from the closed loop tube to the body while flowing through another portion of the closed loop tube; and
at least one barrier located in the portion of the closed loop tube, wherein the barrier is higher than a passage of the fluid in the portion of the closed loop tube in a gravity direction,
wherein the fluid producing bubbles due to absorbing the heat in the portion of the closed loop tube, and parts of the bubbles moving in a direction opposite to a flowing direction of the fluid are intercepted by the barrier.

11. The electronic device as claimed in claim 10, wherein in the gravity direction, the closed loop tube is located on a plane orthogonal to the gravity direction.

12. The electronic device as claimed in claim 10, wherein the body has a main plane larger than other planes, and the closed loop tube is located on a plane parallel to the main plane.

13. The electronic device as claimed in claim 12, further comprising:
a display, located on the main plane of the body.

14. The electronic device as claimed in claim 10, wherein one side of the barrier is on an inner wall of the portion of the closed loop tube, another side of the barrier extends away from the inner wall and forms an opening, and the fluid passes through the opening of the barrier.

15. The electronic device as claimed in claim 10, wherein an extending direction of the barrier is forward to the flowing direction of the fluid in the portion of the closed loop tube.

16. The electronic device as claimed in claim 10, wherein the portion of the closed loop tube is divided into a first section and a second section, the fluid flows from the first section toward the second section, the heat is transferred to the first section, a diameter of the first section is greater than a diameter of the second section, and the barrier is disposed in the first section with an extending direction forward to the flowing direction of the fluid.

17. The electronic device as claimed in claim 16, wherein the barrier is disposed at a convergent portion of the first section connecting to the second section.

18. The electronic device as claimed in claim 16, wherein one side of the barrier is on an inner wall of the first section, and another side of the barrier extends away from the inner wall.

* * * * *

UNITED STATES PATENT AND TRADEMARK OFFICE
CERTIFICATE OF CORRECTION

PATENT NO. : 9,977,474 B2
APPLICATION NO. : 15/081786
DATED : May 22, 2018
INVENTOR(S) : Cheng-Wen Hsieh et al.

Page 1 of 1

It is certified that error appears in the above-identified patent and that said Letters Patent is hereby corrected as shown below:

On the Title Page

Item (30) should be added as follows:
(30) Foreign Application Priority Data
Nov. 7, 2013 (TW) .....................................102140464 A Signed and Sealed this
Twenty-fifth Day of December, 2018

Andrei Iancu
*Director of the United States Patent and Trademark Office*